United States Patent [19]

Tanaka

[11] Patent Number: 5,438,037
[45] Date of Patent: Aug. 1, 1995

[54] METHOD FOR DEPOSITING ANOTHER THIN FILM ON AN OXIDE THIN FILM HAVING PEROVSKITE CRYSTAL STRUCTURE

[75] Inventor: So Tanaka, Osaka, Japan

[73] Assignee: Sumitomo Electric Industries, Ltd., Osaka, Japan

[21] Appl. No.: 227,389

[22] Filed: Apr. 14, 1994

[30] Foreign Application Priority Data

Apr. 14, 1993 [JP] Japan ................... 5-111113

[51] Int. Cl.$^6$ .......................................... H01L 39/24
[52] U.S. Cl. ..................... 505/329; 505/238; 505/473; 505/702; 505/701; 117/108; 427/62; 427/419.2; 427/419.3
[58] Field of Search .............. 505/329, 473, 702, 701, 505/238; 117/108; 427/62, 63, 419.2, 419.3

[56] References Cited

U.S. PATENT DOCUMENTS 5,061,687 10/1991 Takada ............................ 505/702

FOREIGN PATENT DOCUMENTS 0298866 1/1989 European Pat. Off. .
0323342 7/1989 European Pat. Off. .
0459906A2 12/1991 European Pat. Off. .

OTHER PUBLICATIONS

Walkenhorst, et al. *Appl. Phys. Lett.*, "Dielectric properties of SrTiO$_3$ thin films used in high T$_c$ superconducting . . . ", 1992, 60(14):1744–1746.

*Primary Examiner*—Roy V. King
*Attorney, Agent, or Firm*—Foley & Lardner

[57] ABSTRACT

A method for depositing a thin film of a material on an oxide thin film having a perovskite type crystal structure formed on a substrate comprising steps of depositing a seed layer of a single crystal of the material having an extremely thin thickness at a relatively high substrate temperature on the oxide thin film having a perovskite type crystal structure and depositing a thin film of the material on the seed layer at a lower substrate temperature.

18 Claims, 1 Drawing Sheet

U.S. Patent
Aug. 1, 1995
5,438,037
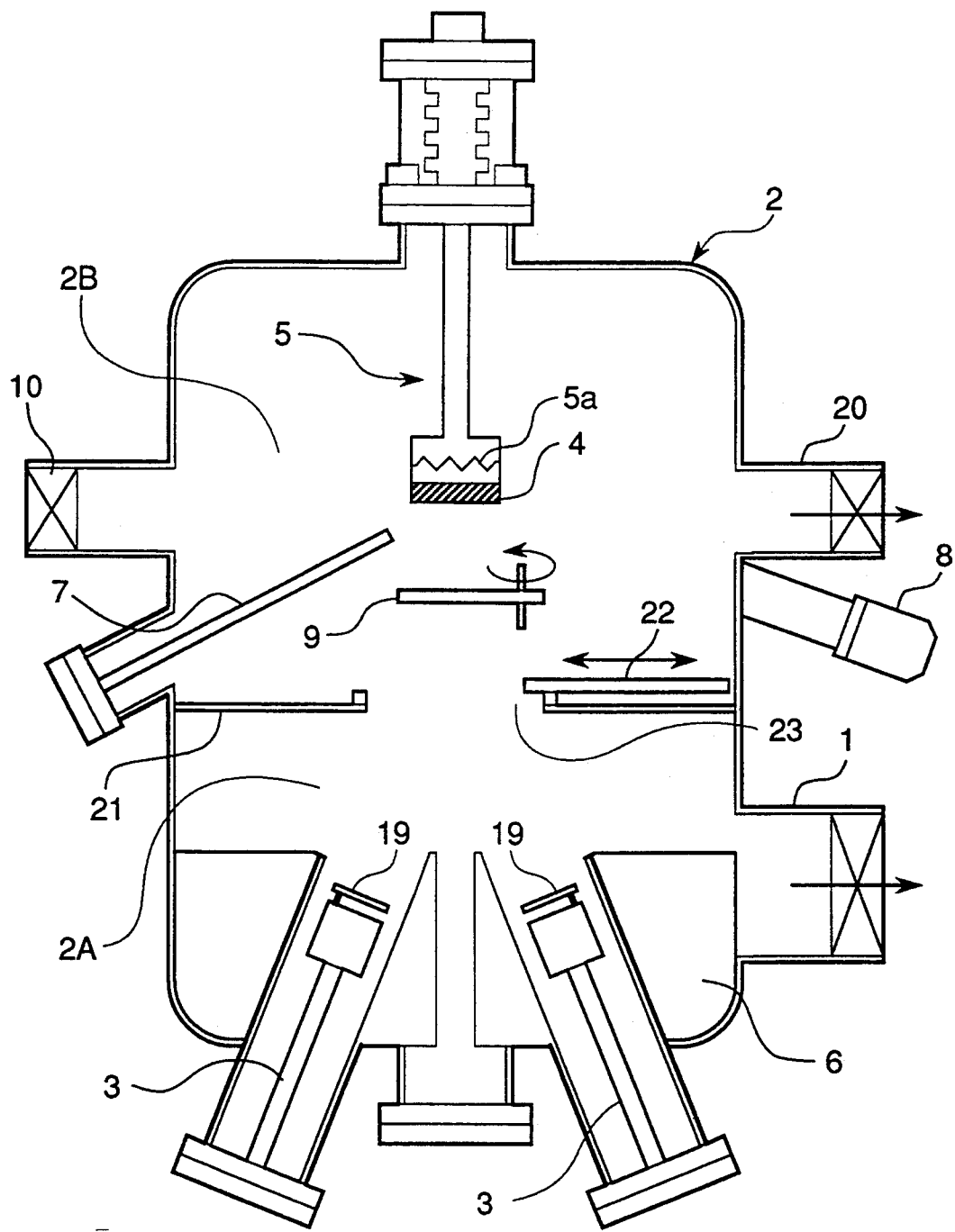

METHOD FOR DEPOSITING ANOTHER THIN FILM ON AN OXIDE THIN FILM HAVING PEROVSKITE CRYSTAL STRUCTURE

BACKGROUND OF THE INVENTION

1. Field of the Invention

The present invention relates to a method for depositing another thin film on an oxide thin film having a perovskite crystal structure, more specifically to a method for depositing another thin film on an oxide thin film having a perovskite crystal structure formed on a substrate with little mutual diffusion at an interface between the thin films.

2. Description of Related Art

Oxide superconductors which have been recently advanced in study have higher critical temperatures than those of metal superconductors, so that they are more practical. For example, Y-Ba-Cu-O type oxide superconductor has a critical temperature higher than 80 K. and it is announced that Bi-Sr-Ca-Cu-O type oxide superconductor and Tl-Ba-Ca-Cu-O type oxide superconductor have critical temperatures higher than 100 K. These oxide superconductors have perovskite type crystal structures.

In order to apply the oxide superconductors to superconducting devices, it is necessary to form oxide superconductor thin films. The superconductor thin films are usually deposited on single crystal substrates, for example a MgO substrate, a $SrTiO_3$ substrate, a YSZ (yttrium stabilized zirconia) substrate, or etc., by various sputterings, an MBE (molecular beam epitaxy), a reactive co-evaporation, a CVD (chemical vapor deposition). The superconductor thin films grow epitaxially on these substrate.

It is also necessary to stack other thin films on the oxide superconductor thin films for manufacturing superconducting devices. For example, a tunnel type Josephson junction comprises a stacked structure of a first superconducting layer, an thin insulator layer and a second superconducting layer stacked in the named order. Therefore, if an oxide superconductor is applied to the tunnel type Josephson junction device, a first oxide superconductor thin film, an insulator thin film and a second oxide superconductor thin film should be stacked in the named order.

A superconducting field effect device, one of three-terminal superconducting devices has a superconducting channel and a gate electrode formed on the superconducting channel through a gate insulating layer. If a superconducting field effect device is manufactured by using an oxide superconductor, it is necessary to stack an oxide superconductor thin film, an insulator thin film and a conductor film.

In addition, in order to fabricate a superconducting multi-layer wiring structure by using an oxide superconductor, oxide superconducting thin films and insulator thin films should be alternately stacked.

In the above superconducting devices and elements, high quality thin films are required. Namely, oxide superconductor thin films and other thin films preferably have not only excellent properties but also high crystallinity. It is more preferable that the thin films are formed of single crystals. If one of the thin films is formed of polycrystals or amorphous, the device or the element may have a low performance or may not operate.

Additionally, in the above superconducting devices and elements, conditions of interfaces between the thin films are also important. It is preferable that there is no mutual diffusion at the interfaces and the interfaces are formed sharply. In particular, if constituent elements of the nonsuperconductor thin films diffuse into the oxide superconductor thin films, superconducting properties of the oxide superconductor thin films are considerably lowered.

In a prior art, when nonsuperconductor thin films are deposited on oxide superconductor thin films formed on substrates, substrate temperatures are equal to or a little lower than ones under which the oxide superconductor thin films has been formed. For example, A. Walkenhorst et al. disclosed in Applied Physics Letter, vol. 60, No. 14, pp. 1744–1746 that they deposited $SrTiO_3$ thin films under substrate temperatures of 750°–800° C. on $Y_1Ba_2Cu_3O_{7-\delta}$ thin films which had been deposited on $SrTiO_3$ substrates under the same substrate temperatures of 750°–800° C.

However, if a nonsuperconductor thin film is deposited on an oxide superconductor thin film under such a high substrate temperature, significant mutual diffusion at the interface is caused. Since, a high temperature of the interface is maintained for a long time. By this, both the oxide superconductor thin film and the nonsuperconductor thin film are degraded so as to have poor qualities and properties.

If the nonsuperconductor thin film is deposited under a lower substrate temperature in order to avoid the mutual diffusion at the interface, the nonsuperconductor thin film becomes low crystallized or may be formed of amorphous so as to have poor properties.

SUMMARY OF THE INVENTION

Accordingly, it is an object of the present invention to provide a method for depositing another thin film on an oxide thin film having a perovskite crystal structure, which have overcome the above mentioned defects of the conventional ones.

Another object of the present invention is to provide a method for depositing another thin film on an oxide superconductor thin film, which have overcome the above mentioned defects of the conventional ones.

The above and other objects of the present invention are achieved in accordance with the present invention by a method for depositing a thin film of a material on an oxide thin film having a perovskite type crystal structure formed on a substrate comprising steps of depositing a seed layer of a single crystal of the material having an extremely thin thickness at a relatively high substrate temperature on the oxide thin film having a perovskite type crystal structure and depositing a thin film of the material on the seed layer at a lower substrate temperature.

Preferably, the substrate temperature under which the thin film of the material is deposited on the seed layer is selected so that little mutual diffusion is occurred at an interface between the thin film and the oxide thin film having a perovskite type crystal structure. Therefore, a stacked structure formed by the method has a sharp interface and little mutual diffusion.

In a preferred embodiment of the present invention, the substrate temperature under which the thin film of the material is deposited on the seed layer is selected so that the oxide thin film is further oxidized so as to improve its properties.

In a preferred embodiment, the oxide thin film is formed of high-$T_c$ (high critical temperature) oxide superconductor, particularly, formed of a high-$T_c$ copper-oxide type compound oxide superconductor for example a Y-Ba-Cu-O compound oxide superconductor material, a Bi-Sr-Ca-Cu-O compound oxide superconductor material, and a Tl-Ba-Ca-Cu-O compound oxide superconductor material.

In addition, the substrate can be formed of an insulating substrate, preferably an oxide single crystalline substrate such as MgO, SrTiO$_3$, CdNdAlO$_4$, etc. These substrate materials are very effective in forming or growing a crystalline film.

The above and other objects, features and advantages of the present invention will be apparent from the following description of preferred embodiments of the invention with reference to the accompanying drawings.

BRIEF DESCRIPTION OF THE DRAWINGS

FIGURE is a diagrammatic sectional view of a film deposition apparatus which can be used for conduct the method in accordance with the present invention.

DESCRIPTION OF THE PREFERRED EMBODIMENTS

Referring to FIGURE, there is shown a diagrammatic sectional view of a film deposition apparatus which can be used for carrying out the process in accordance with the present invention.

The shown film deposition apparatus basically includes a vacuum chamber 2 provided with a main evacuating apparatus 1, at least one K (Knudsen's) cell 3 provided at a bottom of the vacuum chamber 2, and a sample holder 5 provided at a top of the vacuum chamber 2 for holding a substrate 4 on which a film is to be deposited. The sample holder 5 is associated with a heater 5a for heating the substrate. In addition, the vacuum chamber 2 is also provided with a port 10 for exchanging a sample, a liquid nitrogen shroud 6 for forming a cold trap around an evaporation source of the K cell, and a RHEED (Reflecting High Energy Electron Diffraction) device 8 for observing a thin film roughness during the deposition. In front of the substrate held by the sample holder 5, a shutter 9 is located for controlling a deposition time during the deposition process. The K cells 3 are provided with an openable shutter 19.

In addition, a gas supplying apparatus 7 is provided so as to introduce an oxidizing gas such as O$_2$, O$_3$, NO$_2$, N$_2$O, etc. in proximity of the substrate 4 held by the sample holder 5, so that the oxidizing gas can be supplied to form an oxygen-enriched atmosphere in the proximity of the substrate 4 in order to oxidize metal molecular beams incoming from the evaporation source in the course of the film deposition.

Furthermore, the film deposition apparatus additionally includes a partition wall 21 for dividing the vacuum chamber 2 into a first sub-chamber 2A which is constituted of a lower portion of the vacuum chamber defined below the partition wall 21 and which is coupled to the K cell 3, the electron beam gun 11 and the main evacuating apparatus 1, and a second sub-chamber 2B which is constituted of an upper portion of the vacuum chamber defined above the partition wall 21 and in which sample holder 5 is located. The partition wall 21 includes a through opening 23 formed at a center thereof. The position of the opening 23 is determined to ensure that a beam emitted from K cells 3 toward the substrate 4 is not obstructed by the partition wall 21. In addition, the size of the opening 23 is determined to enable restricted molecular flows between the first sub-chamber 2A and the second sub-chamber 2B so that a pressure difference can be created between the first sub-chamber 2A and the second sub-chamber 2B when the opening 23 is open. Therefore, the partition wall 21 having the through opening 23 constitutes a vacuum impedance.

A gate valve 22 is provided on the partition wall 21 for hermetically closing the opening 23 of the partition wall 21, so as to completely shut off the molecular flows between the first sub-chamber 2A and the second sub-chamber 2B when the gate valve 22 is closed. An opening and closing of this gate valve 22 is controlled from the outside of the film deposition apparatus by a not-shown means.

In addition, an auxiliary evacuating apparatus 20 is coupled to the second sub-chamber 2B for evacuating the second sub-chamber 2B to an ultra-high vacuum when the gate valve 22 is closed. The auxiliary evacuating apparatus 20 is constituted of a cryopump. On the other hand, the main evacuating apparatus 1 is constituted of a diffusion pump.

In accordance with the present invention, some stacked structures in each of which a SrTiO$_3$ dielectric thin film was deposited on a Y$_1$Ba$_2$Cu$_3$O$_{7-x}$ ($0<x<1$) oxide superconductor thin film were formed on different SrTiO$_3$ (100) substrates by using the apparatus of FIGURE. Different oxidizing gases were used for forming the stacked structures and the other conditions were equal.

At first, a Y$_1$Ba$_2$Cu$_3$O$_{7-x}$ oxide superconductor thin film was deposited on a SrTiO$_3$ (100) substrate by reactive co-evaporation. A SrTiO$_3$ (100) substrate 4 was set to the sample holder 5, and metal yttrium, metal barium, metal copper, metal strontium and metal titanium were set to five K cells 3 as evaporation sources. Thereafter, the chamber 2 was closed and the gate valve 22 was opened. The vacuum chamber 2 was evacuated by the main evacuating apparatus 1 and the auxiliary evacuating apparatus 20 to an ultra-high vacuum of which the pressure was lower than $1\times10^{-9}$ Torr in which background pressure the film deposition by the MBE process was available. Succeedingly, an oxidizing gas of O$_2$ including O$_3$ was supplied from the gas supplying device 7 so that the pressure near the substrate 4 in the second chamber 2B became $3\times10^{-5}$ Torr.

Some of gases of O$_2$ including 5 to more than 70 volume percent O$_3$ were used as the oxidizing gas. In this connection, a maximum O$_3$ content of the oxidizing gas of the apparatus of FIG. 1, which could be supplied was on the order of 70 volume percent near the substrate 4. O$_3$ was unstable and partially decomposed during supply. Therefore, even if pure O$_3$ was supplied, only O$_2$ including 70 or a little more volume percent O$_3$ reached near the substrate 4.

As mentioned above, the vacuum chamber 2 was provided with the vacuum impedance (the partition wall 21 having the through opening 23), a pressure difference of about one digit or more was created between the first sub-chamber 2A and the second sub-chamber 2B. Pressure of the first sub-chamber 2A was maintained ultra low so that metals evaporation sources were not oxidized and vapors could be efficiently generated after the oxidizing was supplied. In addition, the oxidizing gas jetted from the gas supplying device 7 was struck onto a deposition surface of the substrate, the pressure of the oxidizing gas on the deposition surface of the substrate was further elevated.

Then, the substrate 4 was heated by the heater 5a to a temperature of 700° C. The K cell 3 of metal yttrium was heated to a temperature of 1220° C., the K cell 3 of metal barium was heated to a temperature of 620° C. and the K cell 3 of metal copper was heated to a temperature of 1000° C.

When molecular beams had become to be stably generates from the evaporation sources, the shutters 9 and 19 were opened so as to start deposition of the oxide superconductor thin film onto the substrate 4. At this time, a surface roughness of this deposited film was observed by the RHEED device. The oxide superconductor thin film was grown up to a thickness of 10 nanometers.

Then, the shutters 9 and 19 were closed and the substrate temperature was lowered to 600° C. and the K cell 3 of metal strontium was heated to a temperature of 520° C. and the K cell 3 of metal titanium was heated to a temperature of 1500° C. The shutters 9 and 19 were opened so as to start deposition of a seed layer of a SrTiO$_3$ thin film onto the Y$_1$Ba$_2$Cu$_3$O$_{7-x}$ oxide superconductor thin film. The seed layer was grown up to a thickness of 5 nanometers.

The deposited films were observed by the RHEED device so that it became clear that the seed layers were formed of SrTiO$_3$ single crystals, and uniformly and continuously grown.

The seed layer can be deposited under a substrate temperature of 500° to 800° C. A single crystal SrTiO$_3$ thin film can be deposited on a Y$_1$Ba$_2$Cu$_3$O$_{7-x}$ oxide superconductor thin film under a substrate temperature of 500° to 800° C.

The seed layer should be highly crystallized, and have uniform and continuous structure. For this purpose, the seed layer preferably has a thickness of 2 to 10 nanometers. This thickness is determined by a crystal structure and lattice parameters of the material.

Thereafter, the substrate temperature was further lowered to 400° C., SrTiO$_3$ thin film was additionally deposited on the seed layer so that the whole thickness of the SrTiO$_3$ thin film became 400 nanometers. The deposited film was also observed by the RHEED device so that it became clear that the SrTiO$_3$ thin film was grown up to be a single crystal thin film. The other deposition conditions such as pressure, temperatures of K-cells, the oxidizing gas etc. were equal to those of the seed layer.

In this process, the SrTiO$_3$ thin film can be deposited under a substrate temperature of 300° to 500° C. Little mutual diffusion is caused at an interface between the Y$_1$Ba$_2$Cu$_3$O$_{7-x}$ oxide superconductor thin film and the SrTiO$_3$ thin film at a temperature in the range. In particular, it is preferable that the SrTiO$_3$ thin film is deposited under a substrate temperature of 350° to 500° C. Since, the Y$_1$Ba$_2$Cu$_3$O$_{7-x}$ oxide superconductor thin film is further oxidized at a temperature in this range so that it can be expected that superconducting properties are improved.

After the stacked structures of the Y$_1$Ba$_2$Cu$_3$O$_{7-x}$ oxide superconductor thin films and the SrTiO$_3$ thin films were obtained, crystal structures and conditions of the interface were evaluated by SEM, LEED and XPS without exposing the stacked structure to the air. It became clear that the Y$_1$Ba$_2$Cu$_3$O$_{7-x}$ oxide superconductor thin films and the SrTiO$_3$ thin films were formed of single crystals and the interfaces between them were sharply formed with little mutual diffusion. Therefore, the stacked structures had a small interfacial energy. By this, it was favorable that a gate structure of a superconducting field effect device was formed by the method in accordance with the present invention.

In the above mentioned embodiment, only a 5 nanometers thick SrTiO$_3$ thin films were deposited on the Y$_1$Ba$_2$Cu$_3$O$_{7-x}$ oxide superconductor thin films at a high substrate temperature under which mutual diffusion occurred at the interface, although the SrTiO$_3$ thin films were grown up to a thickness of 400 nanometers finally. The deposition rate of the thin film was mainly determined by the temperatures of K-cells. Therefore, in the above embodiment, a duration in which the interface was maintained at a high temperature of 600° C. and the mutual diffusion occurred was shortened to 1/80.

In addition, the method according to the present invention can be applied to depositing a thin film of an arbitrary material on a thin film of an oxide superconductor or an oxide having a perovskite type crystal structure similar to that of an oxide superconductor, for example Pr$_1$Ba$_2$Cu$_3$O$_{7-y}$ oxide.

Furthermore, the oxide superconductor thin film can be formed of a high-T$_c$ (high critical temperature) oxide superconductor material, particularly a high-T$_c$ copper-oxide type compound oxide superconductor material, for example a Ln-Ba-Cu-O (Ln means a lanthanoide) compound oxide superconductor material, a Bi-Sr-Ca-Cu-O compound oxide superconductor material, and a Tl-Ba-Ca-Cu-O compound oxide superconductor material other than Y$_1$Ba$_2$Cu$_3$O$_{7-x}$ oxide superconductor material.

The thin film deposited on the oxide thin film having a perovskite type crystal structure can be formed of an arbitrary material different from the oxide, for example, an insulator such as SrTiO$_3$, MgO, silicon nitride, a semiconductor, an oxide superconductor, an oxide such as Pr$_1$Ba$_2$Cu$_3$O$_{7-y}$ etc.

The substrate can be formed of for example, an insulator substrate such as a MgO (100) substrate, a SrTiO$_3$ (100) substrate, a CdNdAlO$_4$ (001) substrate or others.

The invention has thus been shown and described with reference to the specific embodiments. However, it should be noted that the present invention is in no way limited to the details of the illustrated structures but converts and modifications may be made within the scope of the appended claims.

I claim:

1. A method for depositing a thin film of a material on an oxide thin film that has a perovskite crystal structure formed on a substrate comprising steps of depositing a single crystal seed layer of the material on the oxide thin film that has the perovskite crystal structure at a first temperature, and depositing a thin film of the material on the seed layer at a second substrate temperature lower than the first substrate temperature, wherein the second temperature is selected so that there is an interface between the thin film and the oxide thin film that has said perovskite crystal structure as the result of little mutual diffusion at the interface.

2. A method as claimed in claim 1, wherein the second substrate temperature under which the thin film of the material is deposited on the seed layer is selected so that the oxide thin film is further oxidized so as to improve its properties.

3. A method as claimed in claim 1, wherein the oxide thin film is formed of high-$T_c$ (high critical temperature) oxide superconductor.

4. A method as claimed in claim 3, wherein the oxide thin film is formed of oxide superconductor material selected from the group consisting of a Y-Ba-Cu-O compound oxide superconductor material, a Bi-Sr-Ca-Cu-O compound oxide superconductor material, and a Tl-Ba-Ca-Cu-O compound oxide superconductor material.

5. A method as claimed in claim 1, wherein the oxide thin film is formed of $Pr_1Ba_2Cu_3O_{7-x}$.

6. A method as claimed in claim 1, wherein the material is an insulator material.

7. A method as claimed in claim 6, wherein the insulator is selected the group consisting of $SrTiO_3$, MgO and silicon nitride.

8. A method claimed in claim 1 wherein the substrate is formed of an insulator.

9. A method claimed in claim 8 wherein the substrate is formed of a material selected from the group consisting of a MgO (100) substrate, a $SrTiO_3$ (100) substrate and a $CdNdAlO_4$ (001) substrate.

10. A method as claimed in claim 3, wherein the oxide thin film is formed of a high-$T_c$ copper-oxide compound oxide superconductor.

11. A method as claimed in claim 1, wherein the seed layer is from 2 to 10 nanometers thick.

12. A method as claimed in claim 1, wherein the first temperature is between 500° and 800° C.

13. A method as claimed in claim 1, wherein the second temperature is between 300° and 500° C.

14. A method as claimed in claim 12, wherein the second temperature is between 300° and 500° C.

15. A method as claimed in claim 14, wherein the seed layer is from 2 to 10 nanometers thick.

16. A method as claimed in claim 1, wherein mutual diffusion occurs only in the seed layer.

17. A method as claimed in claim 11, wherein mutual diffusion occurs only in the seed layer.

18. A method as claimed in claim 10, wherein the oxide thin film is formed of oxide superconductor material selected from the group consisting of a Y-Ba-Cu-O compound oxide superconductor material, a Bi-Sr-Ca-Cu-O compound oxide superconductor material, and a Tl-Ba-Ca-Cu-O compound oxide superconductor material.

* * * * *